United States Patent
Kesil et al.

(10) Patent No.: US 9,911,640 B2
(45) Date of Patent: Mar. 6, 2018

(54) UNIVERSAL GRIPPING AND SUCTION CHUCK

(71) Applicants: Boris Kesil, Santa Clara, CA (US); Elik Gershenzon, Santa Clara, CA (US)

(72) Inventors: Boris Kesil, Santa Clara, CA (US); Elik Gershenzon, Santa Clara, CA (US)

(*) Notice: Subject to any disclaimer, the term of this patent is extended or adjusted under 35 U.S.C. 154(b) by 0 days.

(21) Appl. No.: 14/842,003

(22) Filed: Sep. 1, 2015

(65) Prior Publication Data
US 2017/0062263 A1   Mar. 2, 2017

(51) Int. Cl.
| | |
|---|---|
| B25J 15/06 | (2006.01) |
| H01L 21/687 | (2006.01) |
| H01L 21/683 | (2006.01) |
| B25J 15/00 | (2006.01) |
| B25J 9/16 | (2006.01) |

(Continued)

(52) U.S. Cl.
CPC ........ *H01L 21/6838* (2013.01); *B25J 9/1679* (2013.01); *B25J 13/087* (2013.01); *B25J 15/0028* (2013.01); *B25J 15/0066* (2013.01); *B25J 15/0616* (2013.01); *H01L 21/67259* (2013.01); *H01L 21/67294* (2013.01); *H01L 21/68735* (2013.01)

(58) Field of Classification Search
CPC  B25J 15/0028; B25J 15/0052; B25J 15/0066; B25J 15/0266; B25J 15/0616; B25J 15/0675; B25J 9/1697; B25J 13/086; B25J 13/087; B25J 19/021; B25J 19/025; H01L 21/6838; H01L 21/68707; H01L 21/68735; H01L 21/67259; H01L 21/67294

USPC ................... 294/2, 185, 188, 64.3
See application file for complete search history.

(56) References Cited

U.S. PATENT DOCUMENTS

| | | | |
|---|---|---|---|
| 2,905,768 A * | 9/1959 | Cronquist | G11B 5/60 226/196.1 |
| 3,147,017 A | 9/1964 | Dunham | |
| 4,451,197 A | 5/1984 | Lange | |

(Continued)

FOREIGN PATENT DOCUMENTS

EP   0902966   3/1999

OTHER PUBLICATIONS

Keyence Photoelectric Sensors PR-MB15.

*Primary Examiner* — Dean Kramer

(57) ABSTRACT

Proposed is a universal gripping and suction chuck for use as an interchangeable end effector of a robot arm of a robotic station capable of picking up, transporting, and handling objects having colors and outlines. The chuck housing contains elements of a vacuum system for holding the object by vacuum suction force, a vortex system for holding the objects in a non-contact manner in a state of levitation, and a mechanical edge gripper. The vacuum system, the vortex system, and the mechanical edge gripper can be selectively activated by commands from the central processing system that receives a signal recognition signal, object presence/absence signal and/or object approaching signal from respective sensors and depending on the type of the object recognized by the respective sensor. As a result, the chuck can pick up and handle such different objects as solid semiconductor wafer, paper or fabric interleaves, or small-diameter rings.

19 Claims, 7 Drawing Sheets

(51) Int. Cl.
*B25J 13/08* (2006.01)
*H01L 21/67* (2006.01)

(56) References Cited

U.S. PATENT DOCUMENTS

| | | | | |
|---|---|---|---|---|
| 5,077,888 | A | * | 1/1992 | Tokisue ................ B23P 19/006 29/167 |
| 6,015,174 | A | | 1/2000 | Raes et al. |
| 6,152,507 | A | * | 11/2000 | Pirker .................. B65G 47/911 294/119.1 |
| 6,893,070 | B2 | | 5/2005 | Baker |
| 8,196,983 | B2 | * | 6/2012 | Nagasaka ........... H01L 21/6838 294/64.2 |
| 8,444,126 | B2 | * | 5/2013 | Siebert ................... H01L 21/68 269/21 |
| 2003/0052495 | A1 | | 3/2003 | Casarotti et al. |
| 2006/0157998 | A1 | | 7/2006 | Gershenzon et al. |
| 2011/0148128 | A1 | * | 6/2011 | Hellwig .............. H01L 21/6838 294/64.3 |
| 2014/0227045 | A1 | * | 8/2014 | Iwasaka .............. H01L 21/6838 406/88 |
| 2015/0179495 | A1 | * | 6/2015 | Huang ................ H01L 21/6838 356/237.5 |
| 2015/0325466 | A1 | * | 11/2015 | Wang ................. H01L 21/6838 279/3 |

* cited by examiner

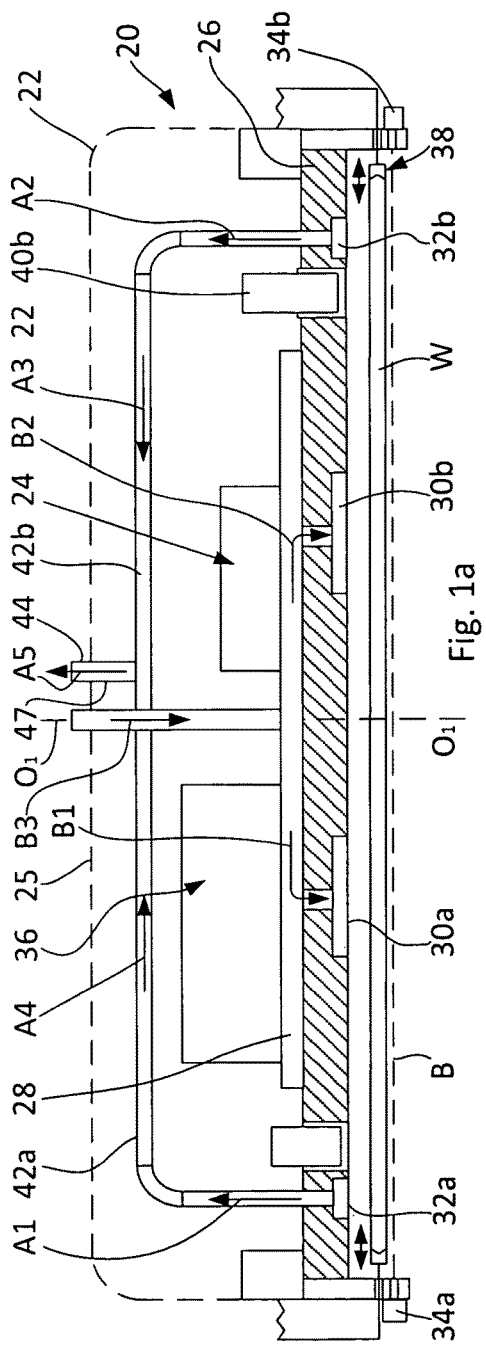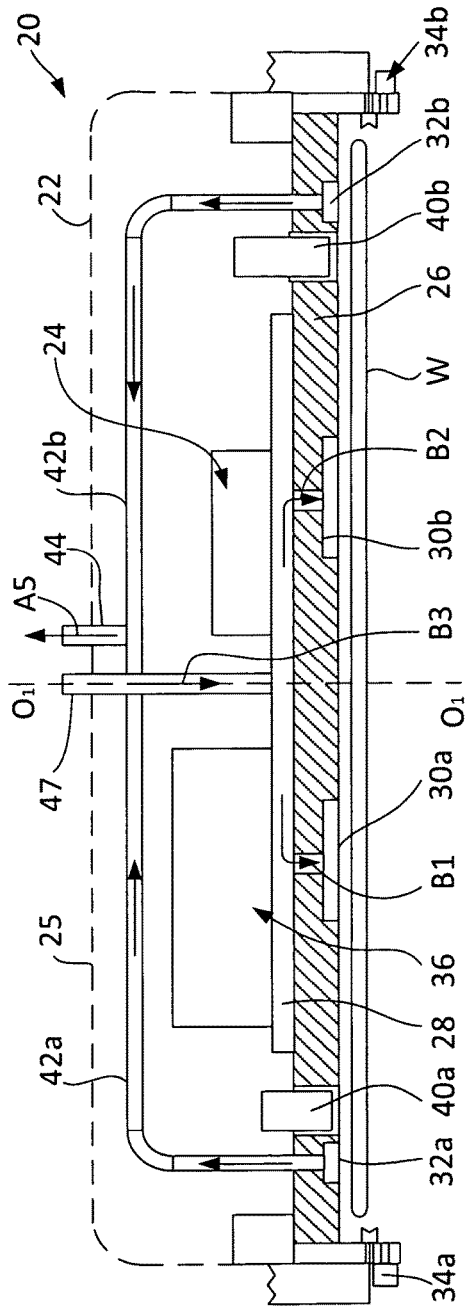

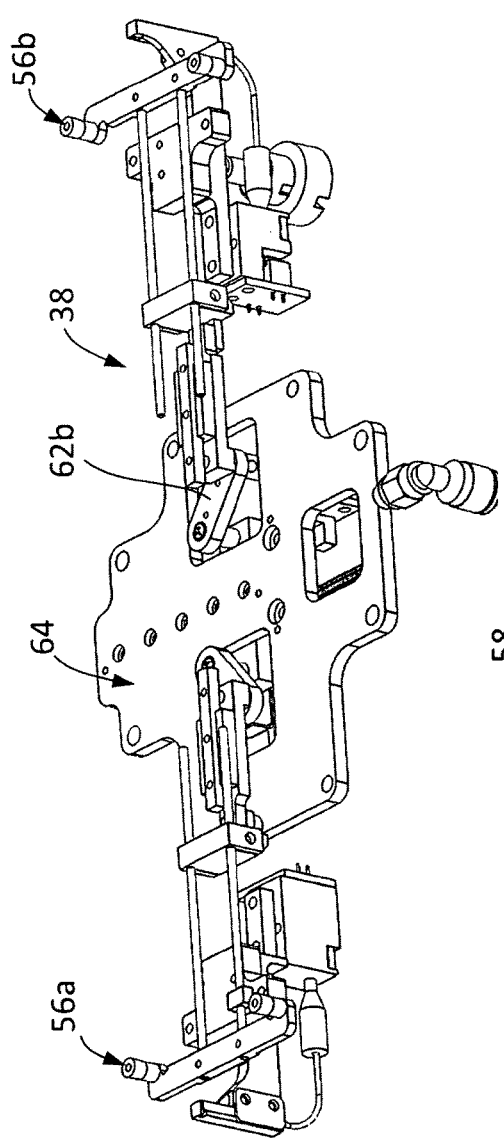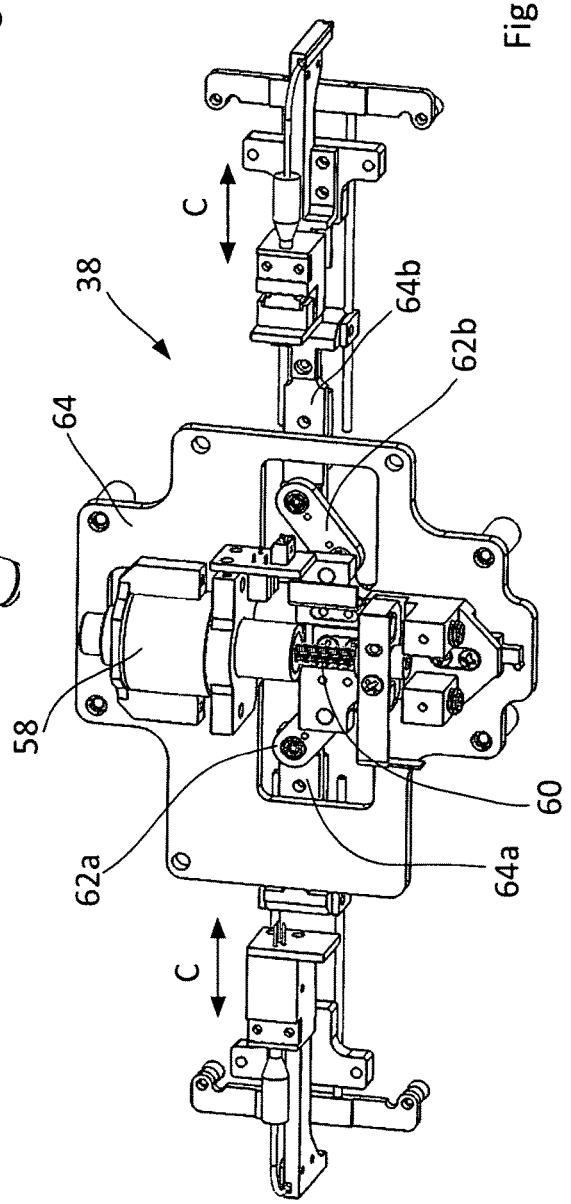

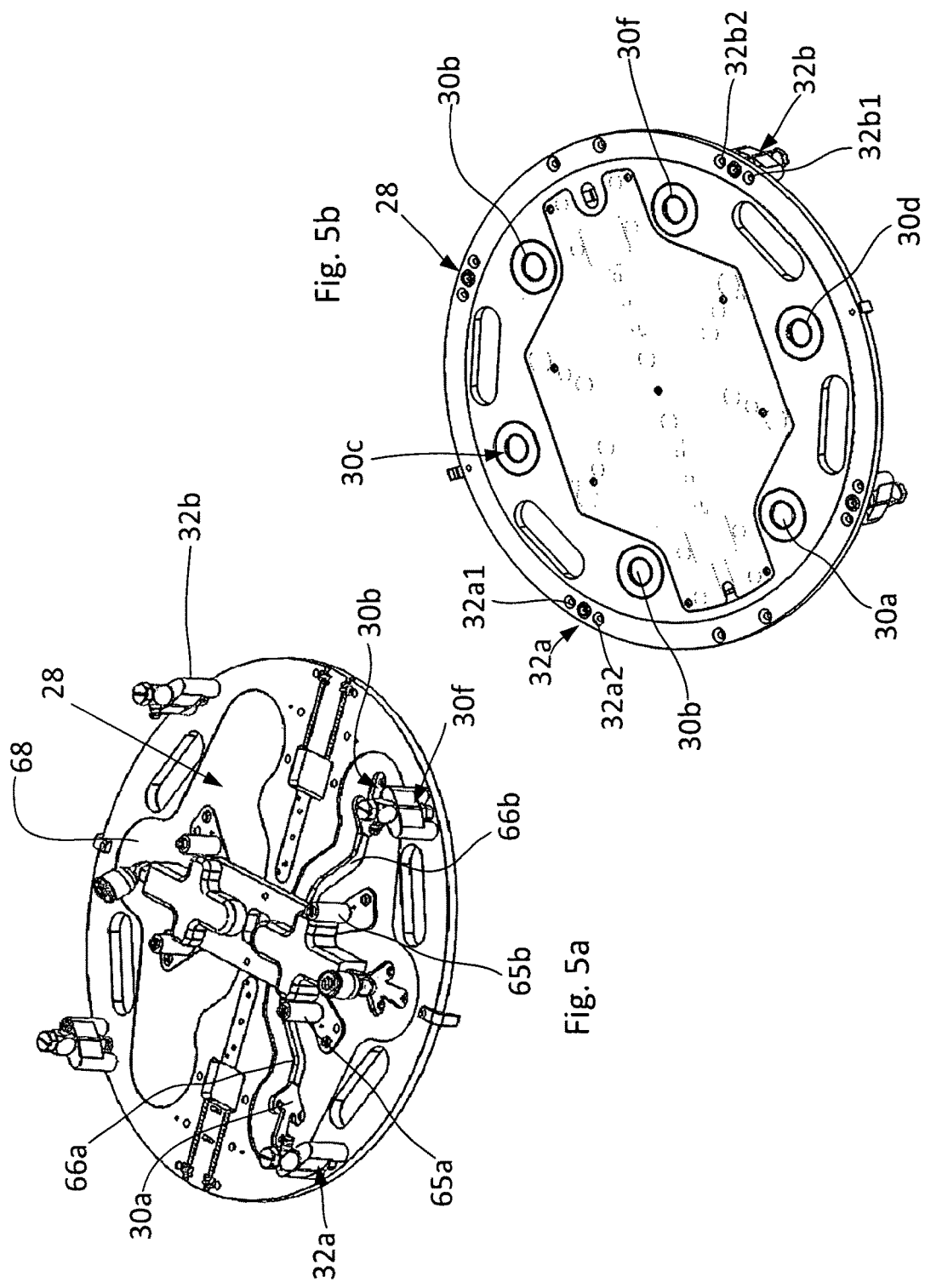

UNIVERSAL GRIPPING AND SUCTION CHUCK

FIELD OF THE INVENTION

The invention relates to semiconductor manufacturing equipment, more particularly to devices for loading/unloading, transporting and handling semiconductor parts of different shapes and properties, such as semiconductor wafer substrates, semiconductor wafers, spacers, etc. More specifically, the invention relates to a universal gripping and suction chuck that combines a mechanical edge gripper with jointly or selectively used vacuum and vortex holders.

BACKGROUND OF THE INVENTION

Many different types of grippers for picking up, transporting, and unloading of semiconductor products, such as semiconductor wafers, wafer substrates, wafer spacers, etc., are known and used in the semiconductor production industry. Such devices are also known as end effectors which can be attached to the end of the mechanical arm, e.g., of an industrial robot. Roughly such devices can be divided into mechanical grippers, vacuum grippers or chucks, or combined vacuum-mechanical devices.

For example, U.S. Pat. No. 6,015,174 discloses an end effector system adapted to be used for robotic tooling applications which allow the end effector to be used to acquire parts by vacuum pick-up or grasping. A vacuum type end effector is provided at the end of each of two robotic tooling fingers. Each vacuum type end effector includes a flexible bellows member on the end thereof such that it can be used for vacuum acquisition. Extending down from each finger to reside adjacent a respective bellows is a pinch member. Through robotic control of the movement of the fingers, finger gripping can be accomplished to grip an object between the two bellows using the pinch members for lateral support. As the part is captured between the two bellows, each bellows is compressed against its respective pinch member. In this manner, the bellows are at least partially collapsed such that a vacuum sensor located in the vacuum supply line to the bellows registers that a vacuum is present and, thus, a part has been acquired. That same vacuum sensor allows the robot to know when a part has been acquired by the bellows in the typical vacuum-type pick-up arrangement.

U.S. Pat. No. 6,893,070 discloses an integrated robot end effector for use in a robotic manufacturing environment. The integrated robot end effector generally includes a circular body having a generally circular rim on an edge thereof. The integrated robot end effector also includes a plurality of orifices through a surface of the body. A plurality of ports extend through a predetermined section of the rim or body of the integrated robot end effector. A plurality of grooves in a surface of the body connects the orifices to the ports within the robot end effector. A cover is secured to the rim of the robot end effector by a retainer. The robot end effector internalizes and integrates all external lines servicing associated vacuum cups or grippers located on the outer surface of the robot end effector.

U.S. Pat. No. 4,451,197 discloses an object detector which incorporates a photoelectric detector in the vacuum flow path of a vacuum pickup system to serve as a device to determine whether an object has been successfully engaged, retained and transported by a vacuum orifice, so that transport cycles may be modified or terminated by control circuitry in the event that the object has not been successfully engaged, retained and transported, thereby saving time and reducing damage to object, transport means or the surface to which the object is transported.

US Patent Application Publication No. 20030052495 published in 2003 discloses a multiple vortex chucks for supporting a wafer. Vortex chucks are located along the periphery of the end-effector to help prevent a flexible wafer from curling. The end-effector has limiters to restrict the lateral movement of a supported wafer. In one example, the end-effector has a detector for detecting the presence of a wafer. The detector is mounted at a shallow angle to allow the end-effector to be positioned close to a wafer to be picked-up, thereby allowing detection of deformed wafers contained in a wafer cassette. The shallow angle of the detector also minimizes the thickness of the end-effector. Also disclosed is a wafer station with features similar to that of the end-effector.

U.S. Pat. No. 3,147,017 discloses a vacuum-actuated chuck for gripping annular workpieces, in which a vacuum-actuated piston-like element acts upon the workpiece to maintain the workpiece advantageously gripped and supported on the chuck. However, while the piston-like element of the chuck does provide for a certain amount of mechanical gripping of the workpiece, substantial gripping action is achieved through the application of vacuum to the workpiece.

European Patent Application Publication No. EP 0902966 WO1997045862A1) (discloses a holder for wafer-like articles. The holder comprises a platform having a wafer-like article facing surface that includes at least one annular groove therein. The annular groove has a ceiling surface therein which is provided with an opening. A gas conducting conduit is connected to the opening. A gas, which introduced into the conduit, exits the conduit through the opening. By choosing a particular orientation of the conduit relative to the annular groove, the gas exiting the opening can be caused to circulate in a clockwise or counter clockwise fashion. The circular flow of gas causes the formation of a vortex adjacent to the article facing surface. A wafer-like article may be held in a suspended state adjacent to the wafer-like article facing surface without contact by the vortex and the gas flowing between the wafer-like article and the article facing surface.

SUMMARY OF THE INVENTION

In spite of the existence of a great variety of end effectors based on mechanical action, vacuum action, vortex principles, or combination of mechanical and vacuum part holders, an actually universal device for loading, unloading and transporting parts of different shapes and properties such as semiconductor wafer substrates, semiconductor wafers, or interleaves having different, flexibility and penetrability to air and made from paper, fabric, plastic materials in the form of disks or rings, etc., are not yet known in the art.

Keeping the above information in mind, the inventors herein have developed a universal gripping and suction chuck that solves the above problems and provides a universal device capable of loading, unloading, and transporting parts of different shapes, flexibility and gas permeability.

This is achieved by incorporating into the body of the chuck three types of carrying means: a mechanical edge gripper, vacuum suction cups, and a vortex-type contactless holder. In order to selectively activate a device needed for a specific operation with, reference to the shape and properties of the material of the part to be processed, the chuck is equipped with sensors that detect the type of object by checking its shape and/or color, or other physical property and activate the necessary combination of carrying means. For example, if the operation is sorting between different semiconductor wafers and spacers such as rigid disk-shaped spacers, ring-shaped spacers, fabric spacers, paper spacers, plastic spacers, etc., the chuck will selectively use a combination of the vortex system with the edge gripper for semiconductor wafers, the vacuum holder for ring-shaped spacers, and will jointly use the vacuum holder and the vortex cups of the vortex system for holding fabric- or paper-made or static dissipative plastic film interleaves in a contactless manner. For detecting the types of the objects to be handled having different shapes, colors, and configurations, the device contains a reflection-type optical sensor that is installed between the suction cups of the vacuum holder. In the industry such sensors are known as RGB sensors. Another advantage of the chuck of the invention is that the edge gripper does not have a radially extending arm that is present in conventional edge grippers for arrangement of the gripper actuating rods or strips. All the gripper actuating members do not go beyond the outlines of the gripper housing. Therefore, the chuck of the invention is suitable for interaction with cylindrical canisters, a.k.a. Horizontal Wafer Shippers, which nowadays are widely used in the semiconductor industry for transporting and storing semiconductor wafer.

BRIEF DESCRIPTION OF THE DRAWINGS

FIG. 1a is a simplified side sectional view of the universal gripping and suction chuck of the present invention with a semiconductor substrate held by an edge gripper.

FIG. 1b is a simplified side sectional view of the universal gripping and suction chuck of the present invention with a semiconductor substrate held in a contactless manner by a vacuum suction holder in combination with a vortex-type holder.

FIG. 4a is a top view of the edge-gripper drive mechanism of the chuck.

FIG. 4b is a bottom view of the mechanism of FIG. 4a.

FIG. 5a shows an interior of the manifold from the top with the cover removed.

FIG. 5b is a bottom view of the chuck of the invention.

FIG. 7a is a sectional view though the nozzle cup and FIG. 7b is a bottom view.

DETAILED DESCRIPTION OF THE INVENTION

Figure 2:
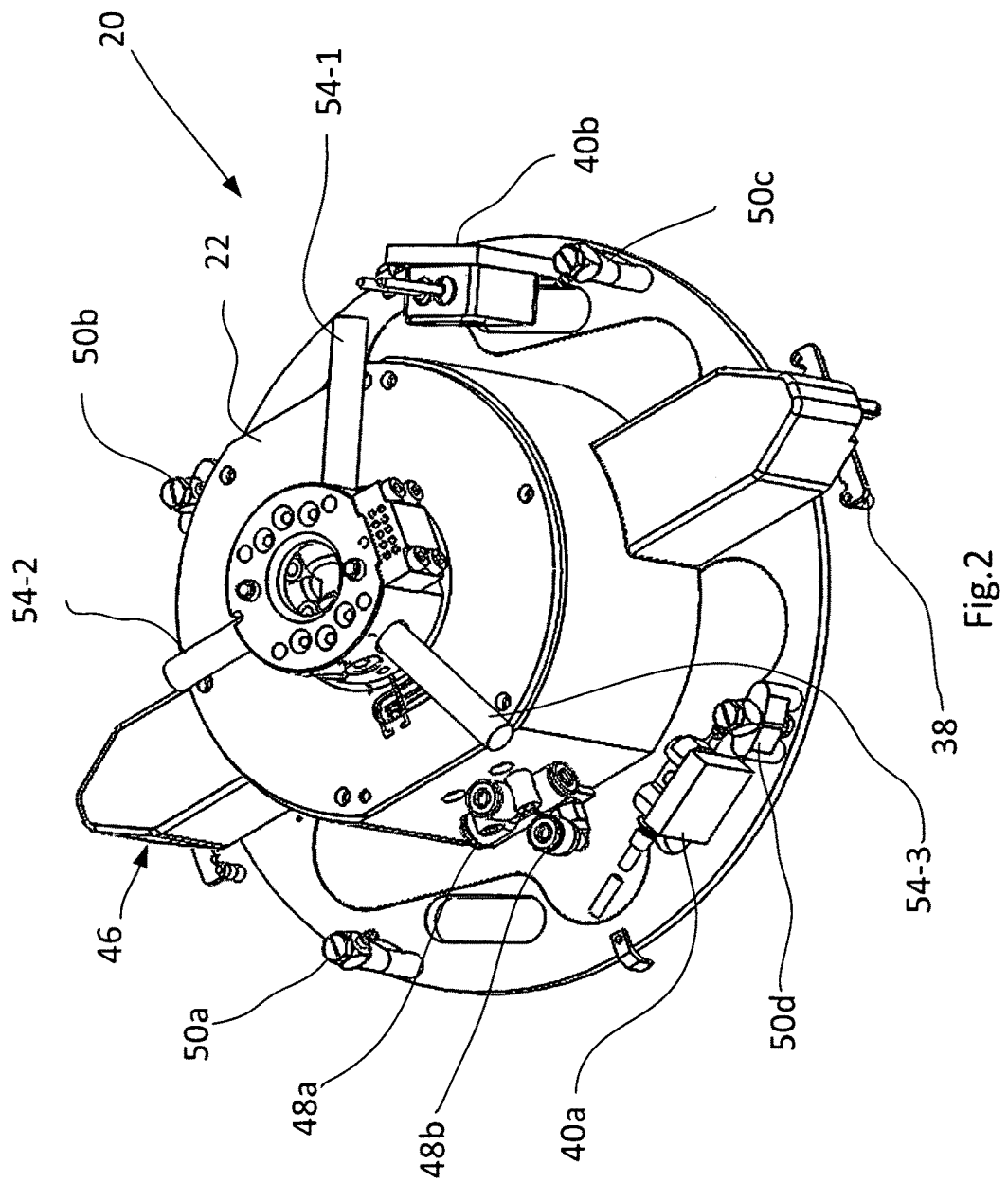
FIG. 2 is a three-dimensional top view of the universal chuck of the invention.

The invention relates to semiconductor manufacturing equipment, more particularly to devices for loading/unloading, transporting and handling semiconductor parts of different shapes and properties, such semiconductor wafer substrates, semiconductor wafers, spacers, etc. More specifically, the invention relates to a universal gripping and suction chucks that combine a mechanical edge gripper with jointly used vacuum and vortex holders (herein after referred to simply as a universal chuck).

The universal chuck of the invention, which as a whole is designated by reference numeral 20, is shown in FIGS. 1a and 1b, wherein FIG. 1a is a simplified side sectional view of the universal chuck of the present invention with a semiconductor substrate W held by an edge gripper, and FIG. 1b is a simplified side sectional view of the universal gripping and suction chuck of the present invention with a semiconductor substrate W held in a contactless manner by a vortex-type levitation chuck in combination with an edge gripping device for holding a substrate in place.

As can be seen from the drawings, the universal chuck 20 comprises a cup-shaped hollow housing 22, which is conventionally shown in a generalized form by dash-and-dot lines. The housing is cup shaped hollow body with an upper plate 25, periphery, and a bottom plate 26.

The housing contains a control block 24, which comprises a conventional central processing unit connected to the sensors and controllers of the actuating mechanisms of the chuck. This control block 24 is beyond the scope of the invention. The interior of the cup-shaped housing 22 also contains a manifold 28 for vortex workpiece holding nozzle cups (only two of which 30a and 30b) of the vortex system are shown in FIGS. 1a and 1b. These workpiece holding vortex nozzle cups are intended for creating a levitation force for holding delicate parts in the chuck 20 in a contactless manner.

Reference numerals 32a and 32b designate suction cups, which are symmetrically along a contour, e.g., circumferentially around the workpiece holding vortex nozzle cups, such as nozzle cups 30a and 30b, at locations closer to the inner wall of the housing 22. Although only two such suction cups are shown, it is understood that a plurality of such cups is provided. The suction cups and the recesses of the vortex system are located in flush with the bottom surface of the housing.

For identification of the type of the workpiece W to be handled by the chuck 20, the chuck is provided with a through-beam sensor consisting of an emitter 34a and 34b located in such a position at which the beam B that passes from the emitter 34a and 34b will always be intersected by a workpiece when the latter is picked up by the chuck.

In other words, the interruption of the optical beam B between the emitter 34a and receiver 34b testifies to the fact that the workpiece W is present in the chuck 20, while free passage of the beam B between the emitter 34a and receiver 34b testifies to the fact that the workpiece is absent in the chuck.

Reference numeral 36 designates a casing that contains drive mechanisms for a soft-touch edge gripper mechanism 38.

The universal chuck 20 is also provided with an optical reflective sensor 40a that detects the fact of approaching of the work piece W, and a color recognition type of the workpiece W. The color recognition sensor is also known as an RGB sensor. An example is Keyence CZ-H32 sensor. Reference numeral 40b designates a proximity sensor that detects approaching of the workpiece when the latter reaches a position at a certain distance from the universal chuck. An example is a Keyence photoelectric sensor PR-MB15.

The arrows in FIGS. 1a and 1b show directions of air flows, wherein arrows A1, A2, A3, A4, and A5 show the air suction direction through a plurality of suction channels, such as channels 42a and 42a to a vacuum pump (not shown) via a channel 44. Axis $O_1$-$O_1$ is a central axis of the chuck 20. The arrows B1, B2, B3 designate flow of air under pressure to vortex nozzle cups 30a and 30b (only two of which are shown in FIGS. 1a and 1b, although a plurality of such cups are arranged circumferentially inside the circumference of the vacuum suction cups 32a and 32b). Reference numeral 45 shows an air channel that supplies air under pressure to the nozzle cups 30a and 30b for generation of the air flows B1 and B2.

Having considered the main structural elements of the universal chuck 20 with reference to FIGS. 1a and 1b, let us further consider the appearance and actual shape and design of the chuck elements.

FIG. 2 is a three-dimensional view of the universal chuck 20 in a real construction, wherein reference numeral 22 designates the cup-shaped housing. The housing is intersected in the diagonal direction by a casing 46 that contain the drive mechanisms of the edge gripper mechanism 38. The drive mechanism of the edge gripper is not shown in FIG. 2 but is shown in FIGS. 4a and 4b, which are described later. Reference numerals 48a and 48b show vortex connectors 47 (FIG. 1a) for connecting a source of compressed air (not shown) to the vortex channels and hence to the vortex nozzle cups 30a and 30b. Reference numerals 50a, 50b, 50c, and 50d show connectors of the vacuum system for connecting the vacuum channels 42a, 42b (and two others, which are not shown) to the channel 44 (FIGS. 1a and 1b) via flexible pipes (not shown).

Since the universal chuck 20 is designed for use as an interchangeable end effector in the system of an industrial robotic station of the type disclosed in pending U.S. patent application Ser. No. 14/724,810 filed by the applicant of the present application on May 29, 2015, it is provided with three radial arms 54-1, 54-2, and 54-3 for interaction with the robot hand and tool locating elements in tool storage sockets of the robotic station. In FIG. 2, reference numeral 40b designates the proximity sensor and 40a designates the RGB sensor.

Figure 3:
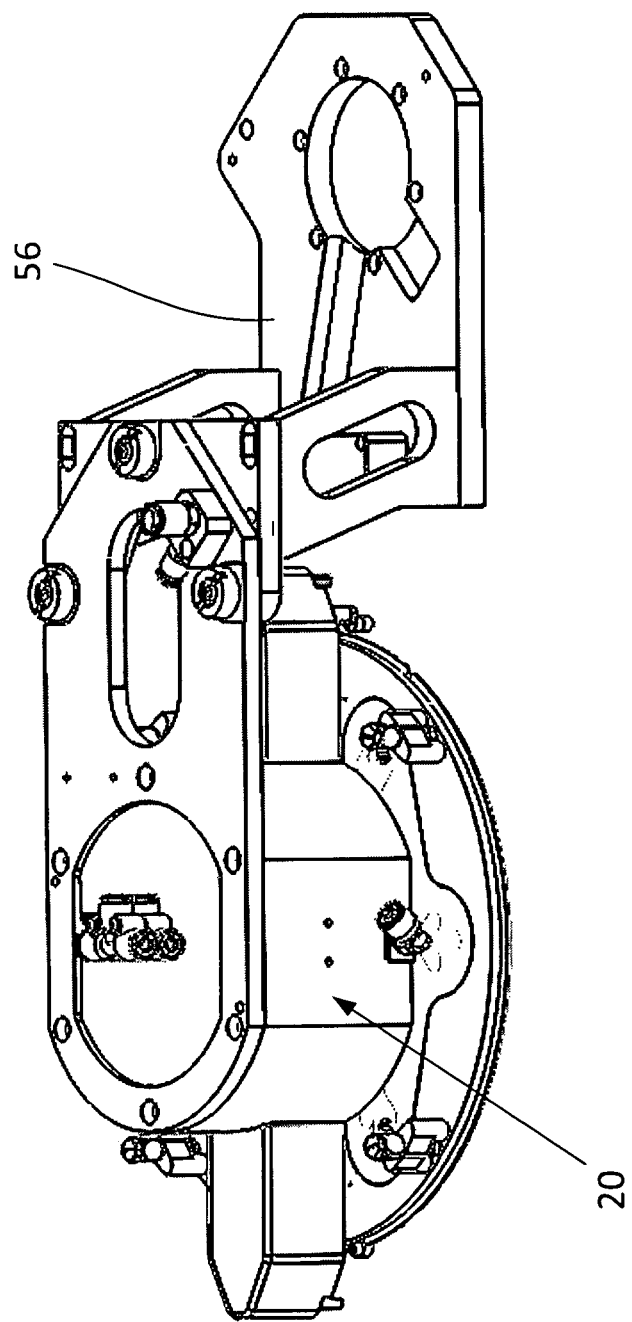
FIG. 3 shows the universal chuck of the invention attached to a radial chuck holder for connection to the robot arm.

FIG. 3 shows the same universal chuck 20 attached to an element for connection to the robot arm, e.g., a radial chuck holder 56 the rear end of which is connected to the robot arm (not shown). Such an attachment can be used for expanding the area of operation of the universal chuck 20.

FIG. 4a is a top view of the edge-gripper drive mechanism 38, which is located in the casing 46 (FIG. 2), and FIG. 4b is a bottom view of the mechanism 38. The soft-touch grippers per se is shown as two pairs of rollers 56a and 56b which are located on diametrically opposite sides of the gripper drive mechanism 38. The grippers 56a and 56b can be driven into linear motions in the direction of arrows C from a stepper motor 58 through a pusher 60 and a group of pivotally connected links 62a, 62b, 64a, 64b, etc., so that a displacement of the pusher 60 in a transverse direction of the gripper mechanism is translated into gripping motion of the rollers 56a and 56b toward each other in the radial direction of the workpiece (not shown in FIGS. 4a and 4b) to be held by the chuck. Reference numeral 64 designates the frame which supports the moveable elements of the gripper drive mechanism 38.

FIG. 5a and FIG. 5b show the interior structure of the manifold 28 (FIG. 1a and FIG. 1b) with the arrangement of a vacuum-pressure system that generates vacuum in the vacuum suction cups 32a and 32b and flows of compressed air in vortex nozzle cups 30a and 30b. In FIGS. 1a and 1b the suction cups are shown conventionally. In a real construction shown in FIG. 5b each suction cup is presented by a pair of orifices such as orifices 32a1, 32a2 and 32b1, 32b2, etc. The openings (not designated) between the suction orifices correspond to a technological threaded opening intended for assembling purposes. Although only two vortex workpiece holding nozzle cups 30a and 30b are shown in FIG. 1a and FIG. 1b, in a real construction there are several pair of diametrically opposite nozzle cups are used in the chuck such as nozzle cups 30a and 30b, 30c and 30d, and 30e and 30f (FIG. 5b). The compressed air is supplied to these nozzles from a compressed air source (not shown) via a channel 47 (FIG. 1a), connectors, such as connectors 65a and 65b, and through the channels, such as channels 66a and 66b (only two of which are shown as other channels are closed by a cover plate 68). These channels are formed by recesses formed in the body of the collector 28 which are then sealed by closing the recesses with a cover plate such as the cover plate 68.

Figure 6:
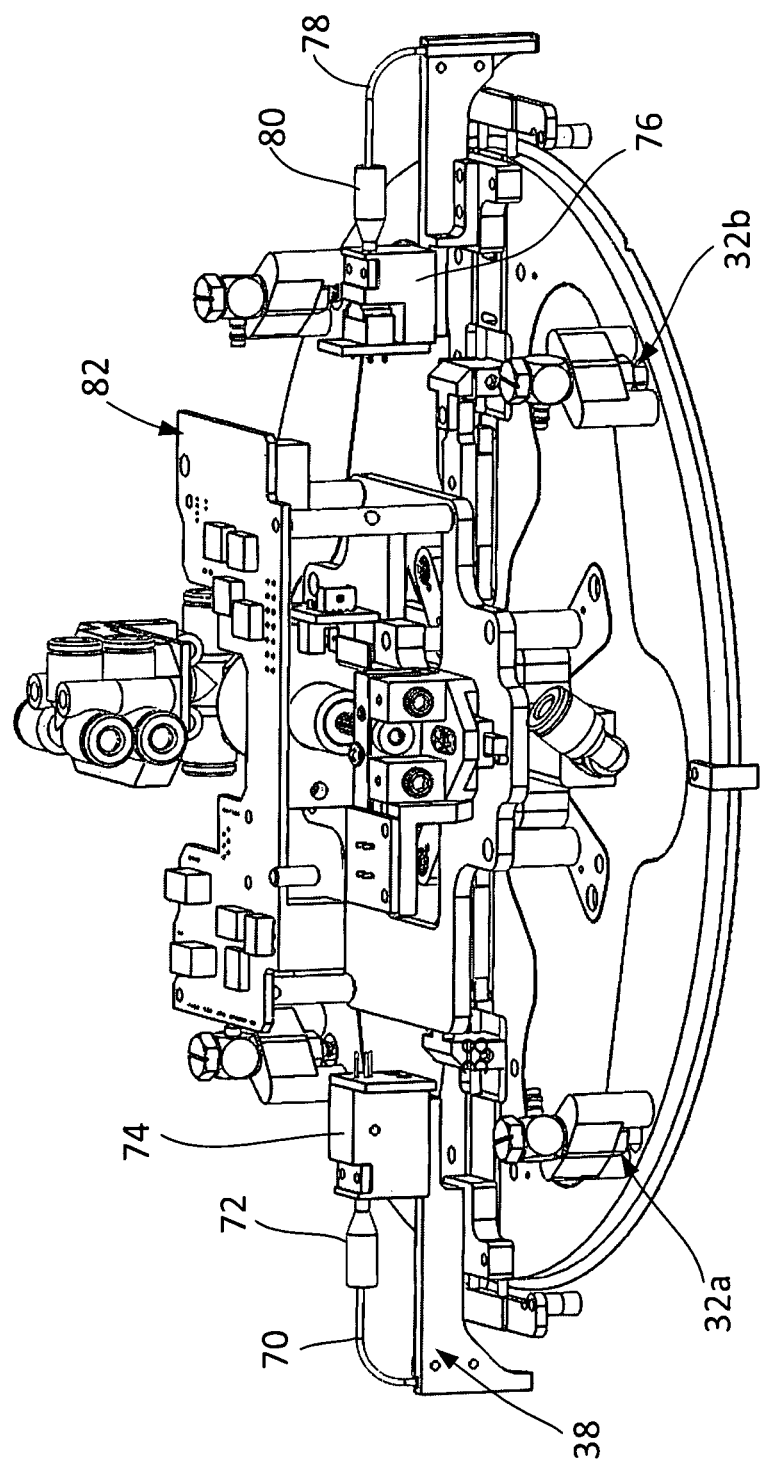
FIG. 6 is a three-dimensional assembly view that shows arrangement of the interior parts located inside the housing of the chuck.

FIG. 6 is a three-dimensional assembly view that shows arrangement of the interior parts located inside the housing 22 of the chuck 20 (FIGS. 1a and 1b).

Apart from the vacuum suction cups 32a and 32b, etc., vortex nozzle cups 30a and 30b, etc., and the edge gripper 38, etc., FIG. 6 also shows an optical fiber 70 that is connected to the aforementioned sensor 34a, 34b which via the emitter 34a and the receiver 34b controls interruption of the beam B by a workpiece to determine the presence of absence of the workpiece in the chuck. Reference numeral 72 designates a ferrule for connection of the optical fiber 70 to a control block 74 of the emitter 34a. Reference numeral 76 designates a control block of the receiver 34b (FIG. 1a and FIG. 1b) which is connected to the control block 76 through an optical fiber 78 via a ferrule 80. A sub-assembly 82 designates an air and vacuum distribution system which is connected to the connectors of the vacuum cups and the connectors of the vortex nozzles by flexible hoses (not shown).

An operation of the universal gripping and suction chuck 20 of the present invention will be considered in connection of its use in a robotic station of the type disclosed in aforementioned pending U.S. patent application Ser. No. 14/724,810.

The robot of the aforementioned robotic station can interchangeably interact with various end effectors, one of which constitutes the universal chuck 20 of the present invention. The end effectors of the station, including the universal chuck 20, are normally stored in respective nests formed in the surface of the working platform of the robotic station. The nests comprise openings having precision prismatic supports while the interchangeable end effectors have three radial projections, such as radial arms 54-1, 54-2, and 54-3 shown in FIG. 2 of the present application. The circumferential position of these radial arms strictly correspond to the positions of the support prisms.

Positions of the support prisms are stored in the memory of the CPU so that the universal chuck 20 may be precisely stored on the respective prismatic support, and the CPU can locate the position thereof and pick it up from the respective nest.

Figure 7B:
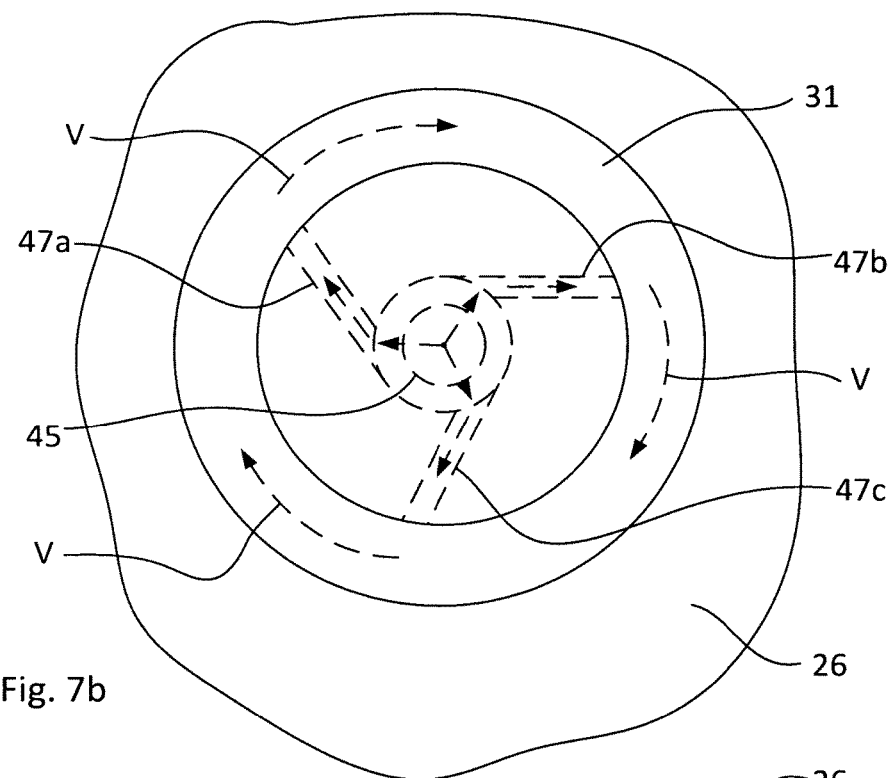
FIGS. 7a and 7b conditionally show the structure of one of the nozzle cups, where
Figure 7A:
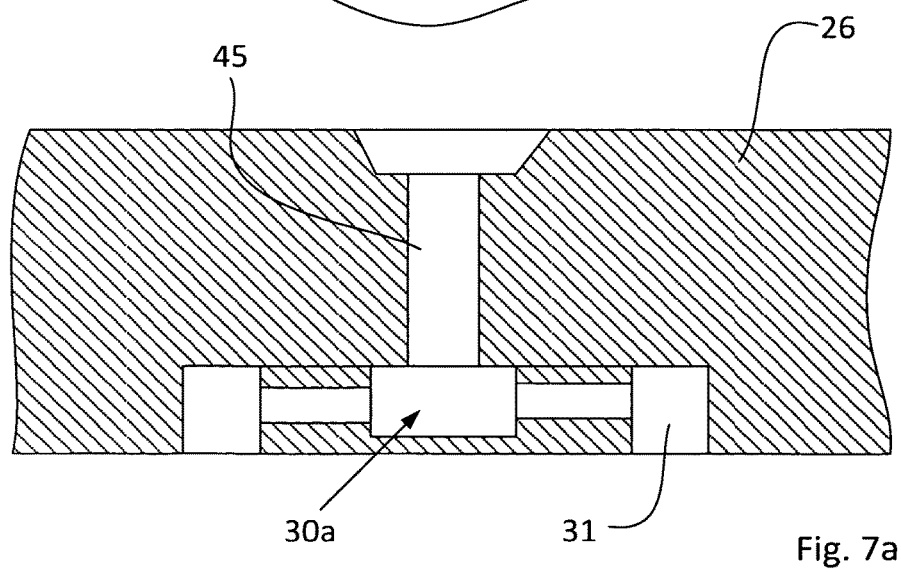

FIGS. 7a and 7b conditionally show the structure of one of the nozzle cups, e.g., a nozzle cup 30a, where FIG. 7a is a sectional view though the nozzle cup, and FIG. 7b is a bottom view (strictly speaking, the sectional view is not in one plane but for conventions two adjacent channels are shown coaxial). It can be seen that each of the oppositely directed vortex nozzle cups 30a and 30b is formed as a recess 31 formed in the bottom plate 26. This recess is connected to the compressed air supply channel 45 (FIG. 1a and FIG. 1b). Radially outwardly from the channel 45 extend air nozzles 47a, 47b, 47c (only three of which are shown for simplification of the drawings). As can be seen from FIG. 7b, the nozzles enter the recess and are arranged substantially tangentially to the cross-sectional shape of the supply channel so that when the air ejected from the nozzles it generates a circular vortex in the vortex cup with circulation of air in the direction of arrows V (FIG. 7b). A mechanical soft-touch edge gripper with such vortex cups is shown in FIG. 6 of US Patent Application Publication No. 20060157998 published on Jul. 20, 2006.

Let us consider the use of the universal chuck on operations of picking up, transporting, processing, and sorting objects of different outlines, density, and gas permittivity, such as rigid semiconductor wafers, smaller diameter rings, as well as paper and fabric interleaves, which in conventional practice require the use of one specific tool for each specific type of an object. For example, a semiconductor wafer should be picked up and handled with an edge gripper that is not suitable for working with objects made from paper or fabric. In contrast to the conventional chuck the universal chuck 20 of the invention can accomplish the above goal.

As mentioned above, the universal chuck 20 is provided with two sensors, one of which, i.e., the RGB sensor 40a (FIG. 1b and FIG. 2), detects the type of the object to be picked up when the mechanical arm approaches the universal chuck 20 held by the arm to the target object.

Let us assume that the object is a rigid semiconductor wafer W (FIGS. 1a and 1b). In this case the control block 24 (FIG. 1a) switches off vacuum holder mechanisms and activates vortex cups and the edge effector 38. During further approach of the chuck 20 to the semiconductor wafer W the second sensor, i.e., the proximity sensor 40b, senses the approach of the wafer and also sends a command to the control block 24 for preparation of the chuck to the object grasping operation. When the wafer intersects the light beam B which passes from the emitter 34a to the receiver 34b, this action confirms the presence of the object inside the chuck, and the receiver 34b send an appropriate command to the control block 24, which, in turn, activates the edge effector 38. With the wafer held by the edge effector, the chuck 20 may transport and deliver the wafer W to the destination. e.g., to a canister (not shown in the drawing of the present application but shown in the drawings of U.S. patent application Ser. No. 14/724,810).

Let us assume now that the object is a ring which has a diameter corresponding to the position of the vacuum cups 32a, 32b, etc. As a result, the chuck 20 can pick up the rings which may be used, e.g., as interleaves between the wafers and can be made from plastic, cardboard, or another material suitable for holding by suction.

In case the object recognized by the aforementioned RGB sensor 40a is an interleaf or a separator made from air-penetrable fabric which cannot be held either by edge gripper or vacuum, the sensors send respective commands to the control block for activation of a vortex in combination with the vacuum system. As a result, such an object is held in a levitation state by the vortex of air emitted from the nozzles 30a 30b. At the same time, the flows A1, A2, A3 (FIG. 1a) of air sucked into the vacuum cups 32a, 32b, etc. stabilize position of the levitated object by restricting its movements in the lateral direction. It is understood that in a real construction the relationship between the force developed by the vacuum and the force developed by the vortex for each specific object can be adjusted.

Although the invention has been described and shown with reference to specific designs and configurations illustrated in the attached drawings, it is understood that these designs and configurations are shown only as examples and that any changes and modifications are possible with the scope of the attached patent claims. For example, the edge gripper may have other drive mechanism. The chuck may have different number of vacuum suction cups and vortex nozzles. The elements for engagement with the storage recesses of the robot station may be different from the radial arms 54-1, 54-2, 54-3. The objects can be identified not only by their shape and colors, but also by other physical properties, such as dielectric constants, or the like. This property can be measured, e.g., by a capacitance sensor. The objects may be made not necessarily from metal, paper, solid plastics, or fabric but also from foam plastics.

The invention claimed is:

1. A universal gripping and suction chuck for use as an interchangeable end effector of a robot arm of a robotic station capable of picking up, transporting, and handling objects having colors and outlines, the chuck comprising:
   a hollow housing having a periphery, an inner wall, and a bottom plate;
   a vacuum system with a plurality of suction cups and suction channels connected to the suction cups formed in the bottom plate of the housing, said suction cups being arranged symmetrically along a first contour;
   a vortex system with nozzles for generation of air flows for holding objects in a state of levitation, the nozzles being located inwardly with respect to the first contour;
   an edge gripper with gripper elements located beyond the outlines of the objects for gripping and releasing the objects;
   at least one sensor for recognizing the color and outlines of the objects and generating an object and color recognition signal; and
   a central processing unit for selectively activating or deactivating one or two of the vacuum system, the vortex system, and the edge gripper in response to the object and color recognition signal obtained from the at least one sensor.

2. The universal gripping and suction chuck according to claim 1, wherein the vortex system comprises a supply channel for the supply of compressed air and a plurality of recesses, the nozzles entering said recesses through the inner wall of the housing and being tangential to the cross-sectional shape of the supply channel.

3. The universal gripping and suction chuck according to claim 2, wherein the suction cups and the recesses of the vortex system are located in flush with the bottom plate of the housing.

4. The universal gripping and suction chuck according to claim 3, wherein the edge gripper is a mechanical soft-touch edge gripper.

5. The universal gripping and suction chuck according to claim 4, wherein the at least one sensor is a reflective type sensor that recognizes the objects by their color and a light reflected therefrom and send the object recognition signal to the central processing unit.

6. The universal gripping and suction chuck according to claim 4, comprising a second sensor which is a proximity sensor that generates an object proximity signal when second sensor is located at a predetermined distance from the object and transmits this signal to the central processing unit.

7. The universal gripping and suction chuck according to claim 4, further comprising an object presence/absence sensor that comprises a beam transmitter and a beam receiver which are located beyond the outlines of the object and generates a beam emitted from the transmitter to the receiver across a path of the object on its way to the suction cups and/or to the recesses of the vortex system, the receiver generating an object presence signal when the object intersects said beam.

8. The universal gripping and suction chuck according to claim 4, further comprising elements for connection to a robot arm of a robotic station.

9. The universal gripping and suction chuck according to claim 3, further comprising an object presence/absence sensor that comprises a beam transmitter and a beam receiver which are located beyond the outlines of the object and generates a beam emitted from the transmitter to the receiver across a path of the object on its way to the suction cups and/or to the recesses of the vortex system, the receiver generating an object presence signal when the object intersects said beam.

10. The universal gripping and suction chuck according to claim 9, further comprising elements for connection to a robot arm of a robotic station.

11. The universal gripping and suction chuck according to claim 3, further comprising elements for connection to a robot arm of a robotic station.

12. The universal gripping and suction chuck according to claim 2, wherein the edge gripper is a mechanical soft-touch edge gripper.

13. The universal gripping and suction chuck according to claim 2, further comprising an object presence/absence sensor that comprises a beam transmitter and a beam receiver which are located beyond the outlines of the object and generates a beam emitted from the transmitter to the receiver across a path of the object on its way to the suction cups and/or to the recesses of the vortex system, the receiver generating an object presence signal when the object intersects said beam.

14. The universal gripping and suction chuck according to claim 1, wherein the edge gripper is a mechanical soft-touch edge gripper.

15. The universal gripping and suction chuck according to claim 14, comprising a second sensor which is a proximity sensor that generates an object proximity signal when second sensor is located at a predetermined distance from the object and transmits this signal to the central processing unit.

16. The universal gripping and suction chuck according to claim 1, wherein the at least one sensor is a reflective type sensor that recognizes the objects by their color and a light reflected therefrom and sends the object recognition signal to the central processing unit.

17. The universal gripping and suction chuck according to claim 1, comprising a second sensor which is a proximity sensor that generates an object proximity signal when second sensor is located at a predetermined distance from the object and transmits this signal to the central processing unit.

18. The universal gripping and suction chuck according to claim 17, further comprising elements for connection to a robot arm of a robotic station.

19. The universal gripping and suction chuck according to claim 1, further comprising elements for connection to a robot arm of a robotic station.

* * * * *